United States Patent [19]

Auslander et al.

[11] Patent Number: 5,068,612

[45] Date of Patent: Nov. 26, 1991

[54] ELECTROMAGNETIC SHIELD FOR AN INDUCTIVE SEARCH COIL ASSEMBLY

[75] Inventors: Klaus Auslander, Reutlingen; Hans-Jurgen Fabris, Pfulligen; Karl-Heinz Mock; Wolfgang Patwald, both of Reutlingen; Helmut Seichter, Pfullingen, all of Fed. Rep. of Germany

[73] Assignee: Institut Dr. Friedrich Forster Prufgeratebau GmbH & Co. KG, Reutlingen, Fed. Rep. of Germany

[21] Appl. No.: 530,020

[22] Filed: May 29, 1990

[30] Foreign Application Priority Data

Jun. 20, 1989 [DE] Fed. Rep. of Germany ....... 3920081

[51] Int. Cl.$^5$ .................. G01V 3/11; H01F 15/04; H01F 15/14; H05K 9/00
[52] U.S. Cl. .................................. 324/327; 324/236; 336/84 C; 336/200
[58] Field of Search ................................ 324/327-329, 324/225, 234, 236-238; 336/84 C, 84 M, 200; 361/412

[56] References Cited

U.S. PATENT DOCUMENTS

| | | | |
|---|---|---|---|
| 3,409,805 | 11/1968 | Whipple et al. | 336/84 C X |
| 3,444,460 | 5/1969 | Penney, Jr. | 324/234 X |
| 3,519,919 | 7/1970 | Rance | 324/328 |
| 3,662,255 | 5/1972 | Garrett | 324/328 |
| 4,451,812 | 5/1984 | Vescovi et al. | 336/84 C |
| 4,593,245 | 6/1986 | Viertl et al. | 324/238 |
| 4,797,614 | 1/1989 | Nelson | 324/236 |
| 4,862,316 | 8/1989 | Smith et al. | 336/84 C X |

*Primary Examiner*—Gerard R. Strecker
*Attorney, Agent, or Firm*—George J. Netter

[57] ABSTRACT

A search coil assembly for an inductive search device is described having a shield formed from a carrier layer and a thin metal coating applied thereupon, in which the coating is arranged into a plurality of parallel circuit tracks. The circuit tracks are electrically connected to one another by connecting tracks and to a reference potential. The described search coil assembly can be advantageously constructed by multi-layer circuit board technology.

1 Claim, 5 Drawing Sheets

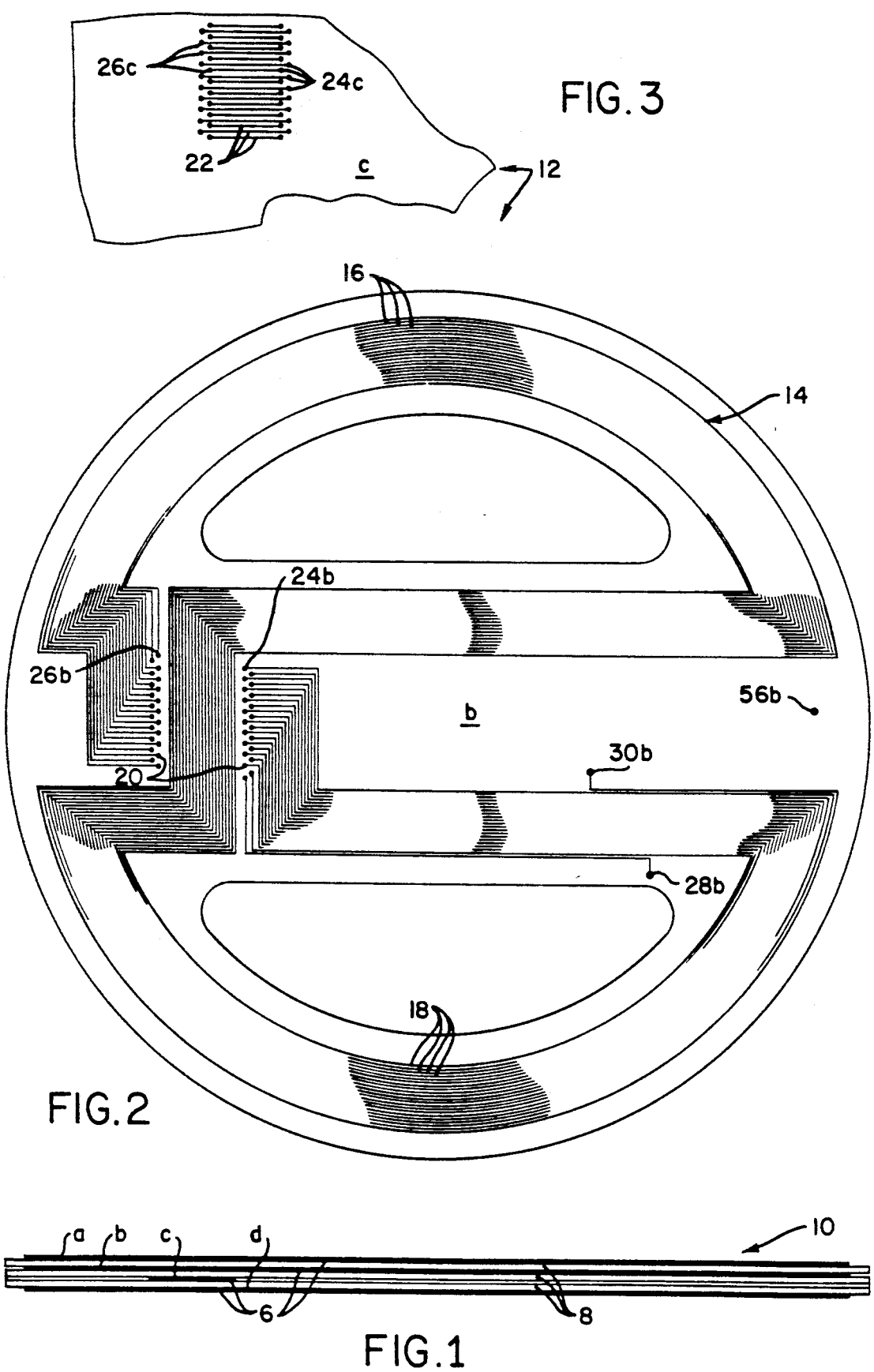

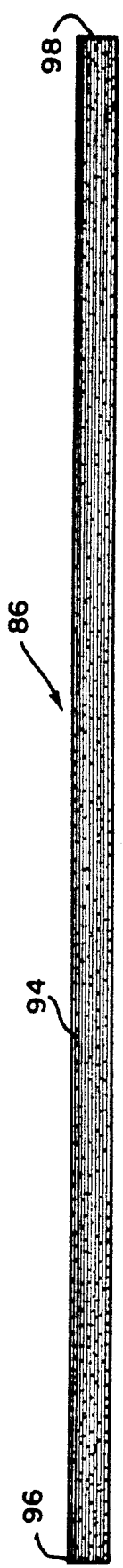
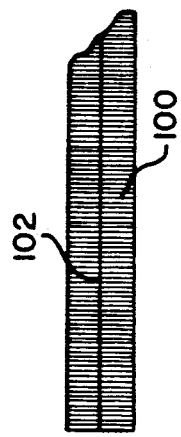
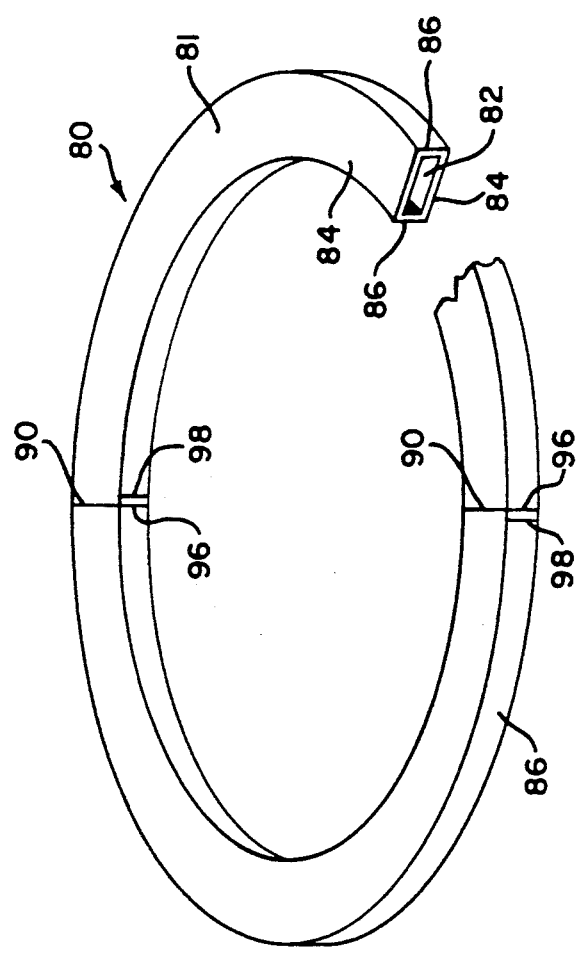

ELECTROMAGNETIC SHIELD FOR AN INDUCTIVE SEARCH COIL ASSEMBLY

BACKGROUND OF THE INVENTION

1. Field of the Invention

The present invention relates to a search coil assembly for an inductive search device for detecting objects of electrically conductive material hidden from direct view as, for example, when buried in the soil or they are surrounded by other materials having a lower electrical conductivity.

2. Description of Related Art

Inductive search devices, whether they are designed as mine search devices, or as so-called "treasure search devices", or as a stationary metal detector, have a high sensitivity, for the most part. Accordingly, if no special counter measures are taken, even the approach of electrically non-conductive or low-conductive objects will effect an undesired and disturbing signal voltage. The reasons for this phenomenon are that the electrical field being built up in the area of the search coil assembly and the dielectric constant in the field area are modified by the approach of the mentioned objects. These capacitive currents will produce a disturbance of adjustment and, thus, interference signal voltages. The most widely used counter measure relies on preventing propagation of the electrical fields outside the search coil assembly search coil with an electrical shield biased to a reference potential, which in general is ground.

The shielding approach is effected, in conventional search coil assemblies, by wrapping the shield around the search coil, as described in DE-GM 83 36 122, for example, such that the latter will be completely surrounded by the shield. Such a shield can be metal foil, a net-type web of thin wires, or a single wire arranged in a tight layer on the search coil. Care must always to be taken, however, that the shield does not form a closed loop. Currents induced in a closed loop would have a retroactive effect on the search coil and would cause interference signals therein. Even the eddy currents generated in such a shield would produce interference signals in the search coil, which are particularly unfavourable, as they continuously vary under temperature change. Metal foils can, therefore, only be used with low frequencies or by providing an approximately large distance between shield and search coil. The same applies for net-type webs, unless they are made of insulated wires.

From GB-A1 22 05 408, there is known a search coil assembly, wherein the search coil is embedded in a block of synthetic plastic material. The block is covered by a closed metal shield, which is held, however, at a sufficient distance from the search coil to prevent eddy currents being formed in the shield. In the same document, another shield is described, which can, because of the reduced electrical conductivity of its material, even be located relatively close to the search coil. Specifically, the shield material contains carbon, e.g. graphite, which is applied in liquid condition for hardening on the inner surface of the search coil frame. Such a shield serves, in the present case, for removing electrostatic charges, and only has limited use in suppressing capacitive interference effects. The necessity of establishment of a satisfactorily high conductivity contact with the carbon-containing material poses problems.

SUMMARY OF THE INVENTION

According to the present invention there is provided a search coil shield which can be easily manufactured and which provides a satisfactory shielding action. By the breakdown of the shield metal coating into a plurality of parallel circuit tracks, the generation of eddy currents is reduced to an insignificant amount with magnetic fields up to relatively high frequencies, so that a close spatial relationship of search coil and shield is made possible. In this way, search coil assemblies can be achieved which are fully shielded against capacitive interference effects, without the dimensions of the search coil being noticeably increased. It is also particularly advantageous in enabling the search coil to be constructed in the form of a printed circuit board, as is described in patent application P 39 12 840, and to adhere the shield on the top and/or bottom side of such printed circuit board. In this way, a very compact search coil assembly is obtained.

Even better results are achieved by providing the search coil as a multi-layer printed circuit board, with the shield assuming the uppermost and/or lowermost layer of the multi-layer printed circuit board. Search coil and shield form, then, an integral part, and can be manufactured in a single production step. An alternative possibility is to build up the shield from a number of printed circuit boards which are combined to form an integral structure. Advantageously, flexible printed circuit boards can also be employed, in order to achieve curved shapes.

DESCRIPTION OF THE DRAWING

In the accompanying drawing:

FIG. 1 is a side elevational view of a search coil assembly of the multi-layer category;

FIG. 2 is a top plan view of the FIG. 1 search coil assembly, b;

FIG. 3 is a bottom plan partially fragmentary view of FIG. 2;

FIG. 4 is a top plan view of the search coil assembly shield, a;

FIG. 8 and 9 depict plan and edge views, respectively, of a search coil assembly;

FIG. 10 is a perspective view of an alternative form of search coil assembly; and FIG. 11 is an alternative shield arrangement.

DESCRIPTION OF PREFERRED EMBODIMENS

Figure 4:
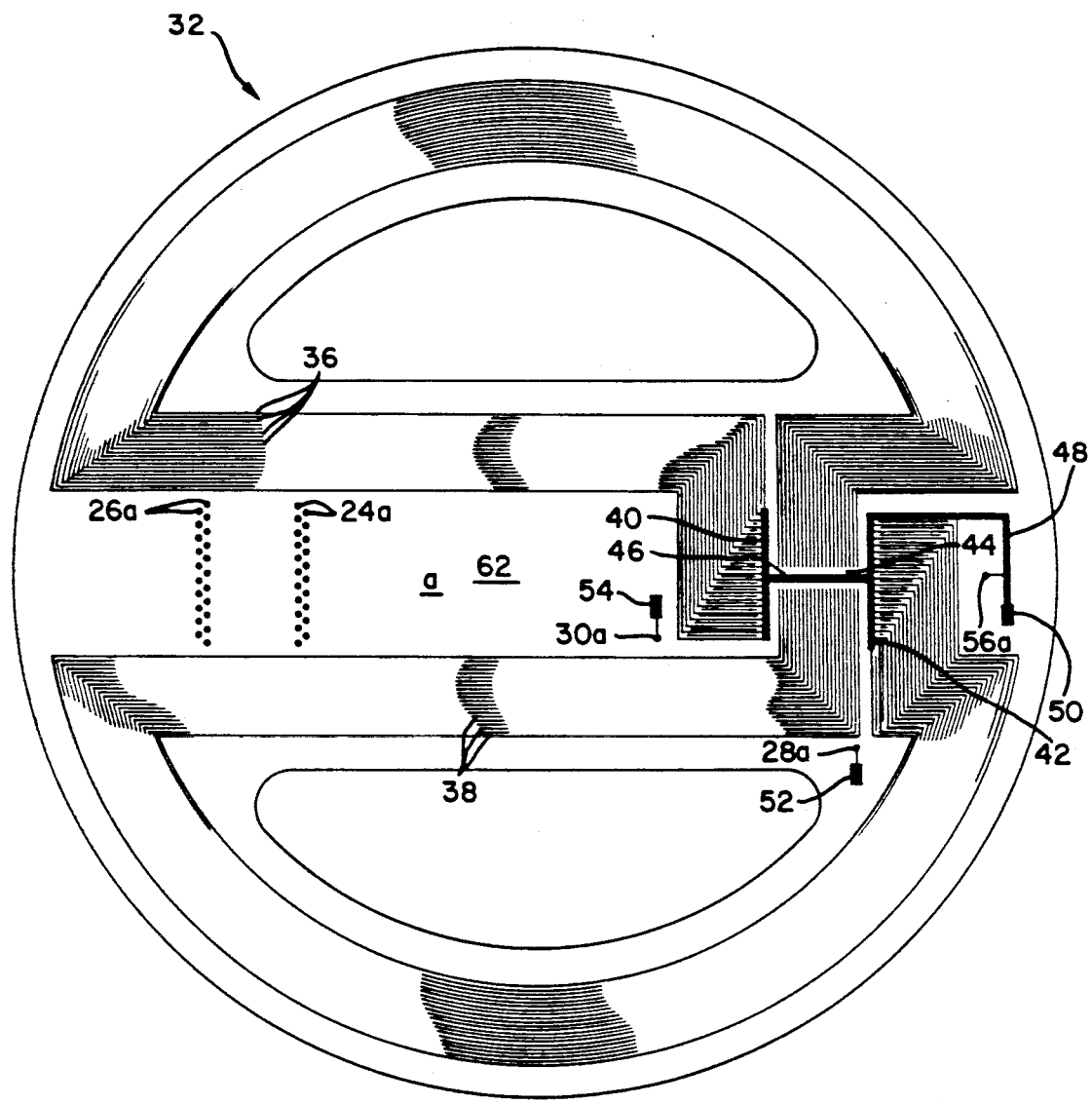

Referring to FIG. 1, there is shown a search coil assembly, which is constructed as a multi-layer printed circuit board 10, i.e., using multi-layer technology. The individual layers (a-d) of the printed circuit board 10 are shown in FIGS. 2 to 5, each in a top plan view. Each layer (a-d) comprises a metal coating 6 resting on an insulating carrier layer 8. The multi-layer technology as such is known to the person skilled in the art of printed circuit boards and, therefore, will not be explained here.

In FIGS. 2 and 3, there is shown a search coil 12 including the two center layers b, c and the construction of which is explained in detail in the West German prior patent application P 39 12 840. The search coil 12 is composed essentially of a conductor band 14 in layer b, such conductor band being, in turn, composed of a plurality of opposed sense loops 16, 18. At the intersection of such loops 16, 18, there are interruptions 20 interconnected by bridges 22 which are in the layer c. The bridges 22 are each connected via through-plated holes 24 and 26 to the ends of the loops 16, 18 at the position of the interruptions 20. The reference numerals of the through-plated holes are provided with an alphabetic index designating the respective layer positions. Following is the path of the loops: starting from the through-plated hole 28, one loop will pass along the lowermost part of the bridges 22 for the interruptions 20 to the outermost edge of the loops 16, and then along the innermost of the loops 18, and, after passing through all of the adjacent loops consecutively, finish at the through plated hole 30.

The layers b, c form, as mentioned above, the actual search coil 12, and are disposed in the center of the printed circuit board 10. In contrast thereto, the layers a and d form the shield 32, 34 in FIGS. 4, 5, and are arranged at the uppermost and lowermost, respectively, positions of the printed circuit board 10. In this way, the shields fully encompass the search coil 12 and provide shielding against capacitive interference from top and from below.

In the top half of the shield 32 shown in FIG. 4, as well as in its bottom half 34 (FIG. 5), a similar layout has been used as for the search coil 12 in layer b, for the sake of simplicity. A plurality of parallel circuit tracks 36 and 38 start from a connecting track 40 or 42, respectively, and establish a tight shield for the coil 12 arranged thereunder. The circuit tracks all terminate in a section 44. Another track 46 connects the connecting tracks 40 and 42 with each other and, therefore, the circuit tracks 36 with the circuit tracks 38. The bottom half of the shield 34 is connected to the top half of shield 32 via through plate hole 56, section 44, another track 46 and connecting track 40 (FIG. 4). The circuit tracks and connecting tracks of the two halves of the shield have, besides, an identical construction. Therefore, identical reference numerals have been selected, so that further description is not necessary.

Connection of the shield to a reference potential, in general electrical ground of the search device, is effected by a solder support point 50. Two additional solder support points 52, 54 are connected, on one hand, via the through-plated holes 28, 30 to the search coil 12 and, on the other hand, to the coil input of the search device. The through-plated holes 24, 26 (appearing in layers a and d) serve only for the process of through-plating and have no terminals in such layers. The same applies for the through-plated holes 28, 30 in layer d and 56 in layer b.

Figure 6:
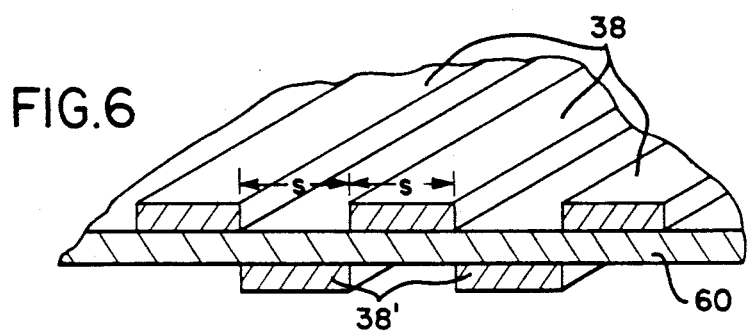
FIG. 6 is a side elevational, sectional view taken through the shield.

Referring to FIG. 6, several circuit tracks 38 are shown in enlarged scale. They all have the same distance s from each other. Furthermore, they have an identical width s. If a relatively low influence of the electrical field is desired (i.e. a particularly good shield action is intended), then two adjacent layers of parallel circuit tracks 38 and 38' are applied on either side of a carrier layer 60, as shown in FIG. 6. Each circuit track of one layer is then located opposite to a gap of the other layer.

An effective shielding action is also achieved by designing the shield such that it projects laterally over the coil arranged thereunder. The area 62 (FIG. 5) between the circuit tracks 36 and 38 can also be provided with parallel circuit tracks connected with the remaining shield. In the latter case, attention must be paid, however, to leaving space free for the through-passings and the terminal solder support points. In principle, the circuit tracks may have any shape, in order to obtain an easily manufacturable layout; however, simple geometrical tracks, e.g. circles and straight lines, are preferred.

The embodiment described heretofore relates to the specially advantageous case of employing the invention for a search coil manufactured in multi-layer technology. The application of the invention is not limited, however, to this case. Rather, the invention can be advantageously employed for search coils manufactured either as printed circuit boards or wound in the conventional manner.

Figure 5:
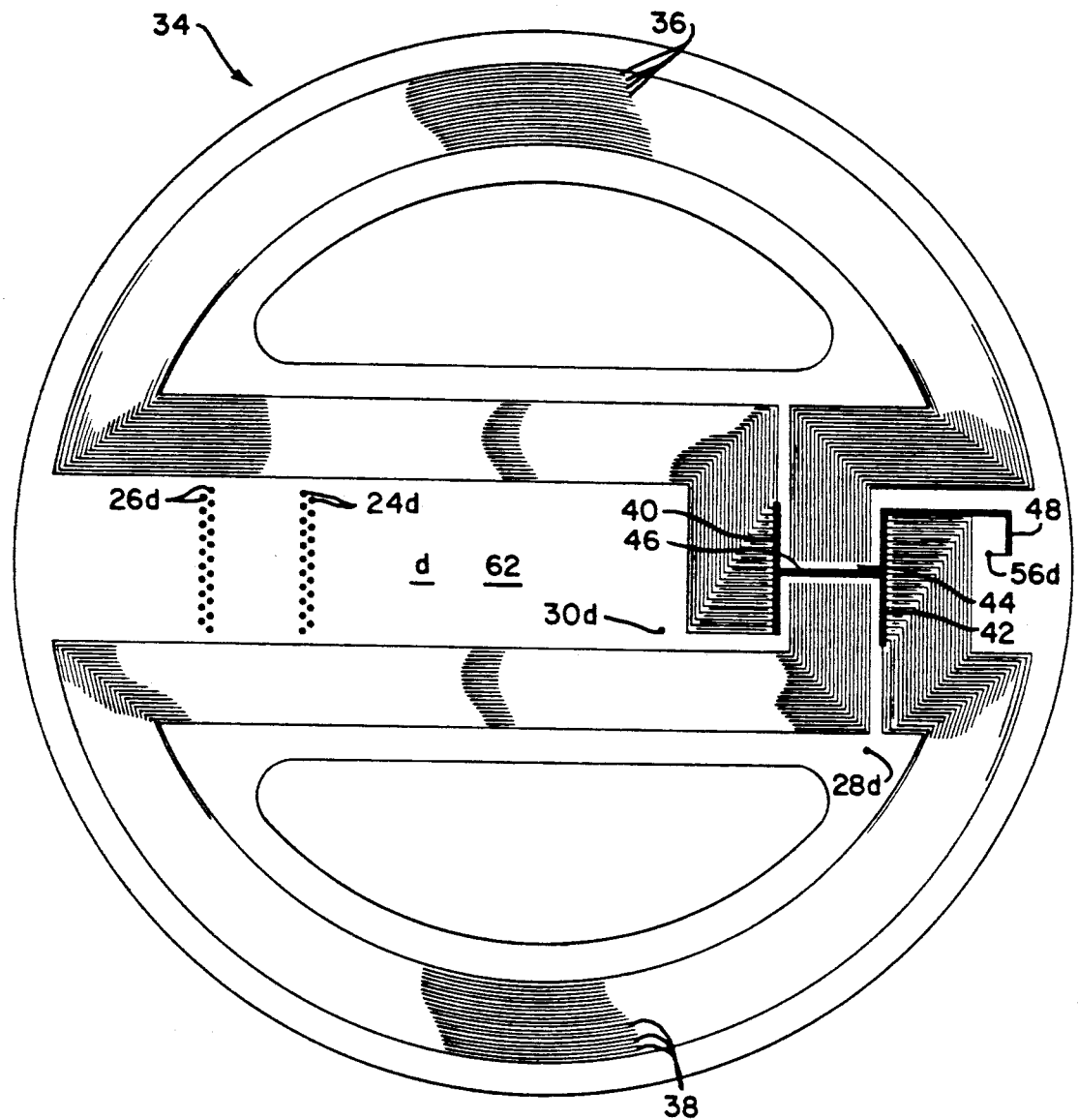
FIG. 5 is a bottom plan view of the seach coil assembly shield, d.
Figure 7:
FIG. 7 is an elevational view of a printed circuit board search coil assembly.

Turning now to FIG. 7, there is shown in front elevational view a search coil assembly 70 having a search coil 72 manufactured as a printed circuit board. It can be a single layer, a double layer or even a multi-layer printed circuit board. Search coils of this kind are described and represented in West German patent document P 39 12 840. Above and below the search coil 72, there are provided two printed circuit boards 74 having the same shape as the search coil 72. Each board comprises a carrier layer 76 and an electrically conductive coating 78 with parallel circuit tracks being connected to one another over connecting tracks, as is shown in FIGS. 4 and 5. By securing the opposite surfaces of the printed circuit boards 72 and 74 to one another by a suitable adhesive, there will result a compact search coil assembly 70 having a shield, the connecting tracks of which are maintained at the ground potential of the search device.

Figure 8:
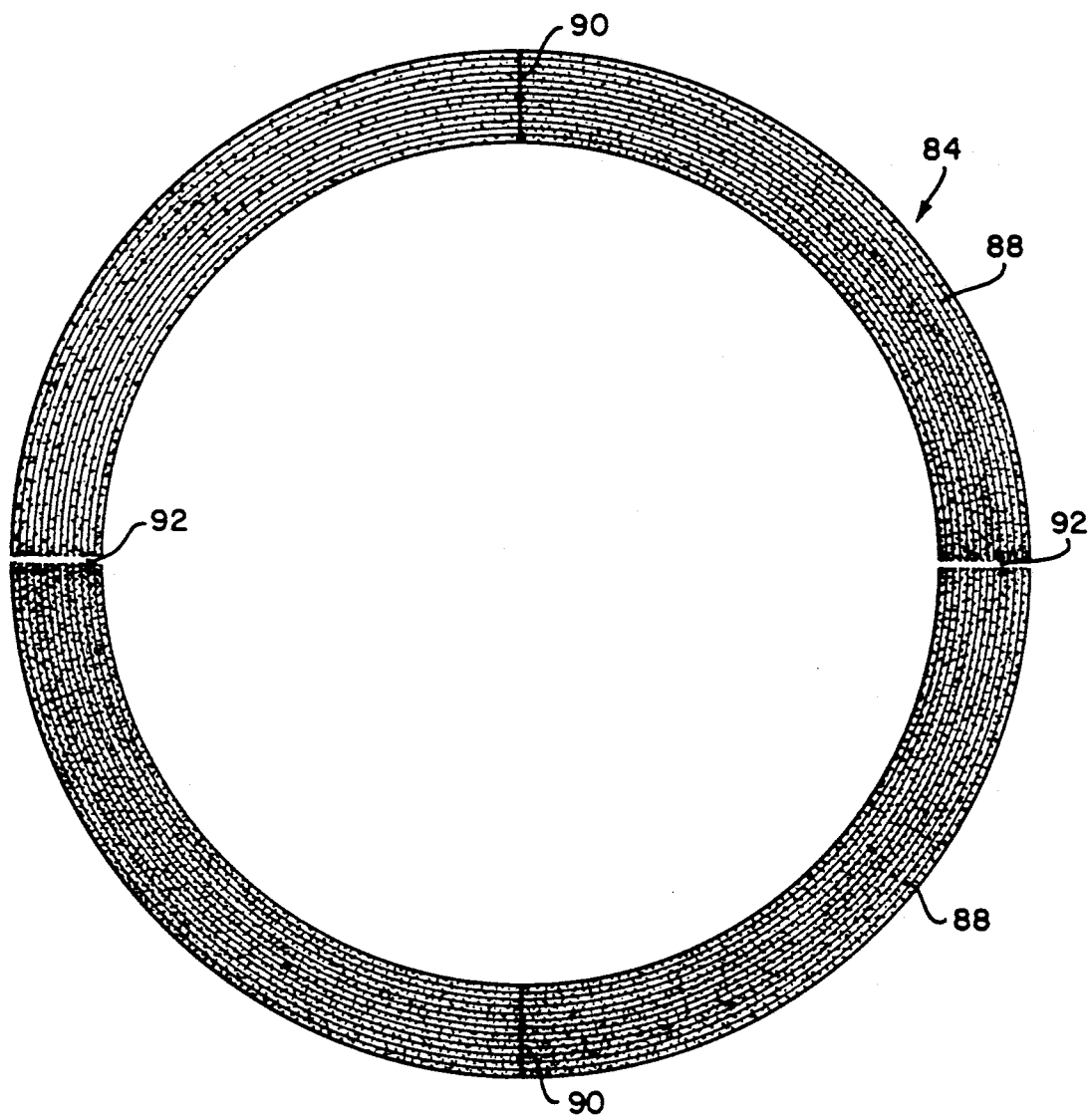

In FIGS. 8, 9 and 10, there is shown a search coil assembly 80 with a conventionally wound search coil 82. The latter can be manufactured by known technology as a self-supporting winding, and has a rectangular cross-section. It is fully included within a shield 81 composed of printed circuit boards 84 and 86. The top or cover and the bottom of such shield 81 are built up from two rigid printed circuit boards 84 with the walls formed from two or four flexible printed circuit boards 86. The printed circuit boards 84 have a plurality of parallel circuit tracks 88 connected to one another over connecting tracks 90. In order to prevent the creation of short circuit loops, the circuit tracks 88 are provided with interruptions. The flexible printed circuit tracks 86 comprise a plurality of parallel circuit tracks 94 connected to one another on one side over connecting track 96 and terminating, however, on the other side at open ends 98. The printed circuit boards 84 and 86 are each mounted such that the connecting tracks 90 and 96 abut against each other and can be contacted electrically. It is important that a sufficient spacing be maintained between the connecting tracks 96 and the open ends 98 of the adjacent printed circuit board 86, and that the connecting tracks 90 and 96 are connected to ground potential of the search device.

Instead of the circuit tracks 88 and 94 of the printed circuit boards 84 or 86, respectively, which extend parallel to the peripheral surface of the circuit board, the circuit tracks 100 can extend transversely of the circuit boards major surface as is indicated in FIG. 11. In this case, the connecting tracks 102 have to be arranged to extend generally parallel to the circuit board major surfaces.

Although the present invention is described in connection with preferred embodiments, it is to be understood that those skilled in the appertaining art may make modifications that still come within the spirit of the invention and ambit of the appended claims.

What is claimed is:

1. A search coil assembly for an inductive search device having at least one search coil for producing a varying magnetic field in a search area and for having electrical signals induced in the search coil when an electrically conductive object is located in the search area, and a shield of electrically conductive material connected to a reference potential, comprising:

the shield includes an insulative carrier layer and a thin metal coating arranged thereupon, said metal coating being composed of a plurality of substantially parallel circuit tracks arranged on two opposite sides of the carrier layer extending partly in straight lines and partly in circular paths electrically connected to one another by connecting tracks to the reference potential, the distances between adjacent circuit tracks being substantially identical to the width of a circuit track;

the circuit tracks on the two sides of the carrier layer being staggered relative to one another such that a gap between each two adjacent circuit tracks on one side is opposed to a circuit track on the other carrier side.

* * * * *